United States Patent [19]

Wang

[11] Patent Number: 5,443,395
[45] Date of Patent: Aug. 22, 1995

[54] EJECTOR SYSTEM FOR AN IC CARD CONNECTOR APPARATUS

[75] Inventor: Leland Wang, Hacienda Heights, Calif.

[73] Assignee: Molex Incorporated, Lisle, Ill.

[21] Appl. No.: 255,601

[22] Filed: Jun. 8, 1994

[51] Int. Cl.6 .............................................. H01R 13/62
[52] U.S. Cl. ...................................... 439/159; 439/152
[58] Field of Search ................................ 439/152–160, 439/351–357, 372

[56] References Cited

U.S. PATENT DOCUMENTS

| | | | |
|---|---|---|---|
| 4,570,196 | 2/1986 | Shimaoka et al. | 360/97 |
| 4,597,173 | 7/1986 | Chino et al. | 439/160 |
| 4,875,867 | 10/1989 | Hoo | 439/160 |
| 4,947,289 | 8/1990 | Dynie | 439/160 |
| 5,208,942 | 5/1993 | Simon | 439/157 |

FOREIGN PATENT DOCUMENTS

0532346A2  9/1992  European Pat. Off. .

*Primary Examiner*—David L. Pirlot
*Attorney, Agent, or Firm*—Stacey E. Caldwell

[57] ABSTRACT

An ejector system is disclosed for use with an IC card connector apparatus. The ejector system includes a header connector into which an IC card is loaded and from which it is ejected. An ejector mechanism is operatively associated with the header connector and is effective to eject the IC card therefrom. The mechanism includes a push-rod reciprocally mounted on an appropriate support structure with a distal end thereof operatively associated with an ejector lever and a proximal end thereof opposite the distal end. A push-button is pivotally mounted on the proximal end of the push-rod for pivotal movement between an operative position projecting generally coaxially of the push-rod and an inoperative position rotated from the operative position to one side of the push-rod. Complementary inter-engaging detents are provided between the push-button and the push-rod to resist pivotal movement of the push-button from its operative position to its inoperative position.

20 Claims, 4 Drawing Sheets

EJECTOR SYSTEM FOR AN IC CARD CONNECTOR APPARATUS

FIELD OF THE INVENTION

This invention generally relates to the art of electrical connectors and, particularly, to an ejector system for IC card connector apparatus.

BACKGROUND OF THE INVENTION

Generally, IC cards or packs, such as memory cards, are data input devices which are electrically connected to an electronic apparatus or storage device, such as a word processor, personal computer, or other electronic apparatus. The data stored in the IC card is transferred to the electronic apparatus. Memory cards are portable instruments which are readily inserted and extracted from a connector apparatus, such as a header connector, which may be used with the IC card for removably coupling the IC card to a printed circuit board, for instance.

A conventional connector apparatus for an IC pack or memory card includes a generally U-shaped frame having a pair of guide grooves inside a pair of side frame portions, with a connector section joining or extending between the side frame portions. Generally, the connector apparatus defines a terminating end and a mating end, the mating end including the guide grooves. A planar IC card is inserted into the apparatus within the side guide grooves. A transverse array of socket terminals at a lead edge of the IC card electrically connect an associated array of pin terminals on the connector section at the mating end of the connector apparatus.

Such connector apparatus often are provided as header connectors used for interconnecting the semiconductor circuit of the IC card to an external circuit such as a main electronic unit. The header connector may be used with an IC card for removably coupling the IC card to a printed circuit board. The IC card is inserted into the header connector and is extracted therefrom as needed. The extraction force of the IC card, i.e. the force between the respective terminal pins on the header connector and the respective socket terminals on the IC card, is relatively high due to the tight fit required to obtain a good electrical interconnection between the terminals. These terminals typically are disposed at a high density which further increases the extraction forces. Originally, when an IC card was to be extracted from a header connector, the card was grasped by a user and simply pulled out.

More recently, a variety of ejector mechanisms have been incorporated in various connector apparatus, such as the header connectors, for facilitating ejection of the IC card from the connector. Such ejector mechanisms have been incorporated as integral or unitary devices fabricated as a part of the connector apparatus or header connector, itself. Such assemblies or systems have proven quite expensive and elaborate. On the other hand, separate ejector mechanisms have been provided for assembly or mounting to or about the header connector, such as after the header connector has been coupled to a printed circuit board.

A typical IC card ejector mechanism includes at least a housing frame or support for mounting about the header connector. An eject lever is mounted either on the frame, the header connector or therebetween. The eject lever is adapted to eject the IC card from the header connector. A push-rod or actuator is slidably or reciprocally mounted on the ejector frame for actuating the eject lever.

It is proposed to provide a push-button mounted on the front or proximal end of the actuating push-rod. In such applications as computers or the like, the push-button projects away from the front face of the computer or a card-receiving housing for actuation by a user. Because the push-button projects from the front face a certain distance, the button may be inadvertently actuated and ejection of the memory card can occur unintentionally. This is undesirable, particularly if data transfer between the IC card and an underlying electronic apparatus is in process or if the current program or process is dependent on the presence of a card. Furthermore, the presence of a push-button or other projection on the face of a computer, particularly a lap top or notebook style computer, can be inconvenient in terms of carrying or packaging the computer and can interfere with insertion of an IC card. Accordingly, it is desirable to provide a fold-down or rotating push-button to minimize inadvertent ejection of the IC card, to reduce interference with the insertion of the card, and to maintain a flush front face of the computer.

On the other hand, such a pivotal push-button on the proximal end of the push-rod, itself, can cause problems. In particular, with the push-button in an operative position generally coaxial with the push-rod, the push-button may have a tendency to rotate when force is applied thereto. Such unwanted rotation is undesirable and, in fact, can result in jamming or breakage of the small parts. The present invention is directed to solving these various problems.

SUMMARY OF THE INVENTION

An object, therefore, of the invention is to provide a new and improved ejector system for an IC card connector apparatus.

In the exemplary embodiment of the invention, the ejector system includes a header connector into which an IC card is inserted and from which it is ejected. An ejecting means, such as a lever, is operatively associated with the header connector and is effective to eject the IC card from the header connector. A push-rod is reciprocally mounted on an appropriate support structure with a distal end thereof operatively associated with the ejecting means and a proximal end thereof near a front or card insertion end of the apparatus.

The invention contemplates the provision of a push-button pivotally mounted on the proximal end of the push-rod for pivotal movement between an operative position projecting generally coaxially of the push-rod and an inoperative position to one side of the push-rod. Complementary interengaging detent means are provided between the push-button and the push-rod to resist pivotal movement of the push-button from its operative position to its inoperative position.

As disclosed herein, the detent means is provided by a detent boss on one of the push-button and the push-rod that is engageable axially in a detent recess in the other of the push-button and the push-rod when the push-button is in its operative position. Further, the push-button is mounted for axial movement on the push-rod when the push-button is in its operative position for engaging the detent boss in the detent recess in response to axial pressure applied to the push-button.

As another feature of the invention, the detent boss and detent recess are provided as a primary detent means. A secondary detent means also are provided in the form of a pair of transverse opposing flat surfaces on the push-button and the push-rod, the flat surfaces being engageable when the push-button is in its operative position and axial pressure is applied thereto. One of the flat surfaces is shorter than the other to define detent corners that resist pivotal movement of the push-button. The sides of the push-button are chamfered at opposite ends of the flat surface to allow pivotal movement of the push-button when desired and to provide tactile feedback upon movement of the push-button between positions.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
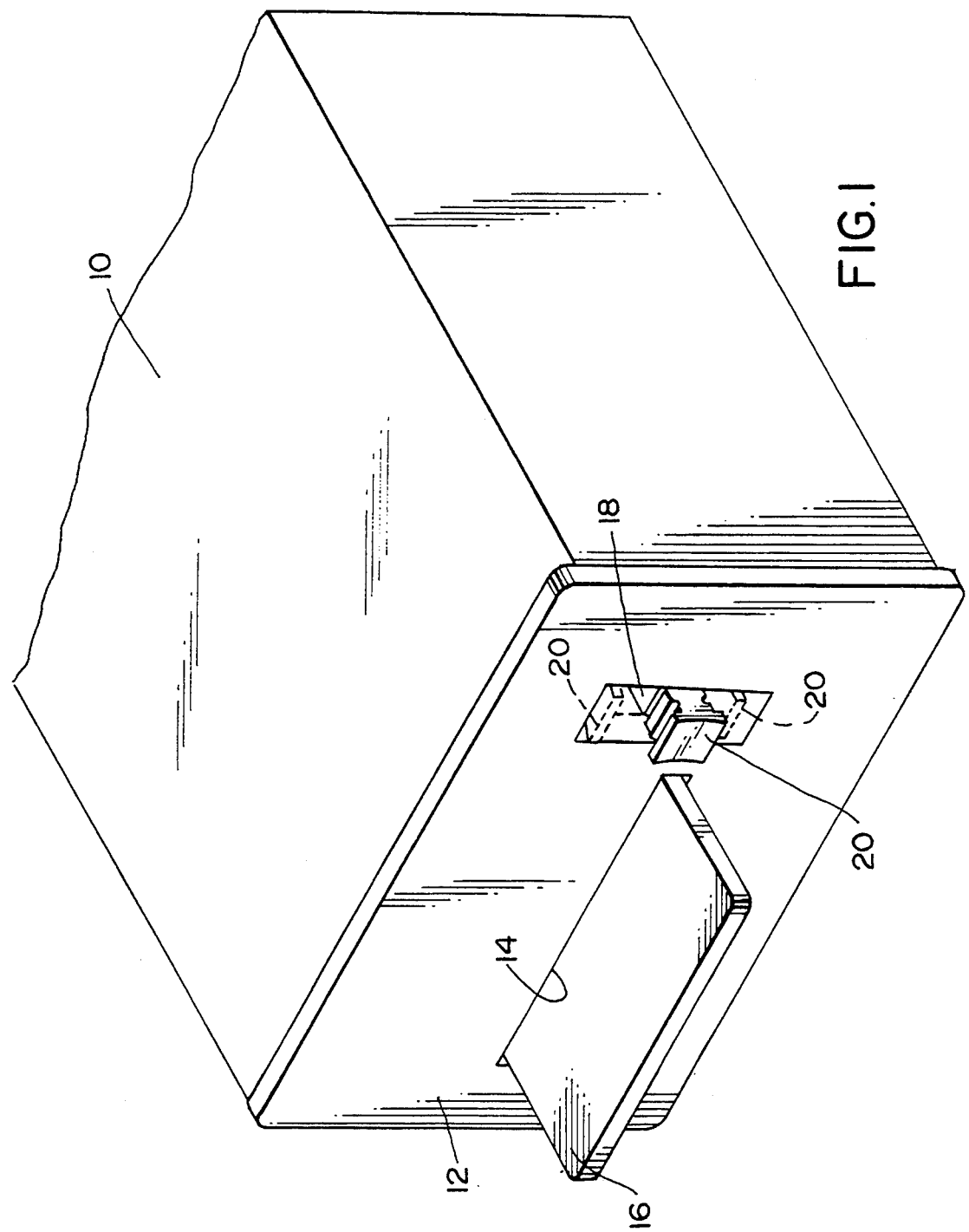
FIG. 1 is a perspective view of a housing from which the push-button of the invention projects alongside a partially ejected IC card, also projecting from the front face of the housing.

Referring to the drawings in greater detail, and first to FIG. 1, the invention is embodied in an ejector system which has a variety of uses in IC card connector apparatus. The ejector system may be mounted within a computer housing 10 having a front face 12 with a slot 14 into which an IC card 16 is inserted and from which it is ejected. FIG. 1 shows a proximal end 18 of a push-rod of the ejector system, with a push-button 20 mounted thereon, extending generally coaxially of the push-rod, and projecting from front face 12 in an operative position. The push-button is shown in phantom in FIG. 1 recessed from front face 12 in inoperative positions along either opposite side of the push-rod.

Figure 2:
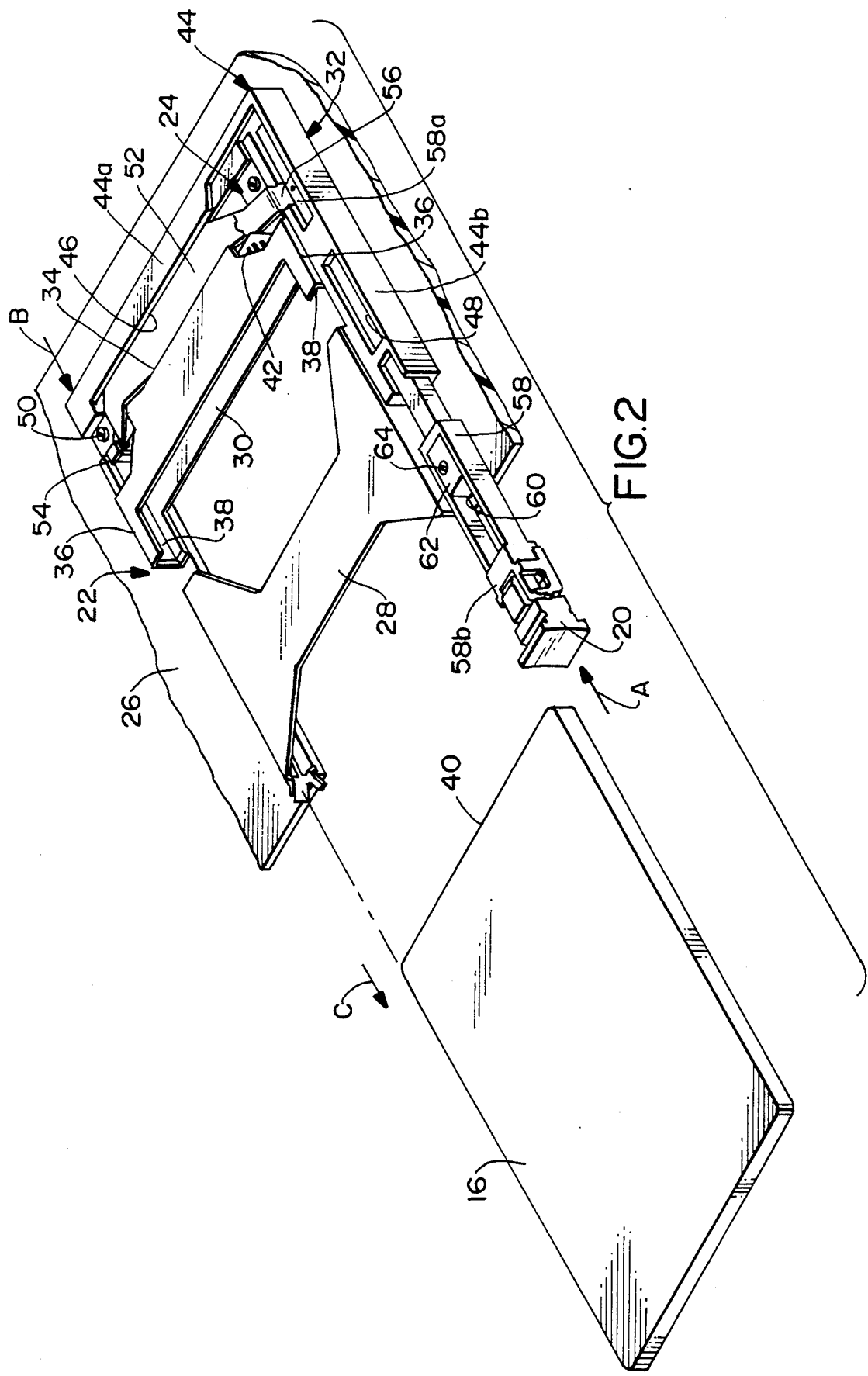
FIG. 2 is a perspective view of the ejector system of the invention mounted on a printed circuit board, with the IC card fully ejected from the ejector system and spaced outwardly therefrom.

Referring to FIG. 2, a connector apparatus, generally designated 22, is shown to include a header connector, generally designated 24, mounted on a printed circuit board 26. Generally, header connector 24 receives IC card 16 inserted through a stamped and formed metal guide 28 and into a mating end 30 of the header connector. An ejector mechanism, generally designated 32, is mounted about header connector 24 for ejecting IC card 16 therefrom.

Header connector 24 includes a terminating end 34 opposite mating end 30, along with opposite sides 36 extending between the ends. A pair of guide grooves 38 are provided on the insides of opposite sides 36 for guiding a leading edge 40 of IC card 16 into mating end 30 of the header connector. As is well known in the art, a transverse array of socket terminals (not shown) along leading edge 40 of IC card 16 electrically interconnect with an associated array of pin terminals 42 extending through header connector 24. Although not visible in the drawings, pin terminals 42 have pin portions within mating end 30 for insertion into the socket terminals along edge 40 of the IC card. The pin terminals 42 have tail portions for solder connection to circuit traces on the printed circuit board.

Ejector mechanism 32 includes a one-piece unitarily molded, generally L-shaped ejector frame, generally designated 44. The L-shaped configuration thereby defines a base leg 44a and a side leg 44b. An inwardly directed groove 46 is formed in base leg 44a generally facing header connector 24. A channel 48 is formed in side leg 44b. The L-shaped ejector frame is adapted for mounting to printed circuit board 26 about header connector 24 as seen in FIG. 2, such as by appropriate fastening means 50 and other fastening means not visible in the drawing.

An eject lever 52 is mounted in groove 46 of ejector frame 44 and also in a groove along terminating end 34 of the header connector. The eject lever has a first lever end 54 adapted to eject IC card 16 from the header connector, and a second lever end 56.

An elongated push-rod 58 is reciprocally mounted in channel 48 within side leg 44b of ejector frame 44. The push-rod has a guide groove 60 for receiving a slide block 62 that is fixed by fastening means 64 to printed circuit board 26 and which may be integrally formed with side leg 44b. The push-rod has a distal end 58a pivotally connected to second lever end 56 of eject lever 52. The push-rod has a proximal end 58b onto which push-button 20 is pivotally connected, as described in greater detail hereinafter. In essence, manual pushing on push-button 20 in the direction of arrow "A" causes push-rod 58 to linearly move within channel 48 of ejector frame leg 44b. With the distal end 58a of the push-rod pivotally connected to end 56 of eject lever 52, end 56 of the eject lever will pivot within slot 46 of the ejector frame and cause the opposite end 54 of the lever to move in the direction of arrow "B" engaging a portion of leading edge 40 of IC card 16, and ejecting the IC card out of the apparatus in the direction of arrow "C".

Figure 3:
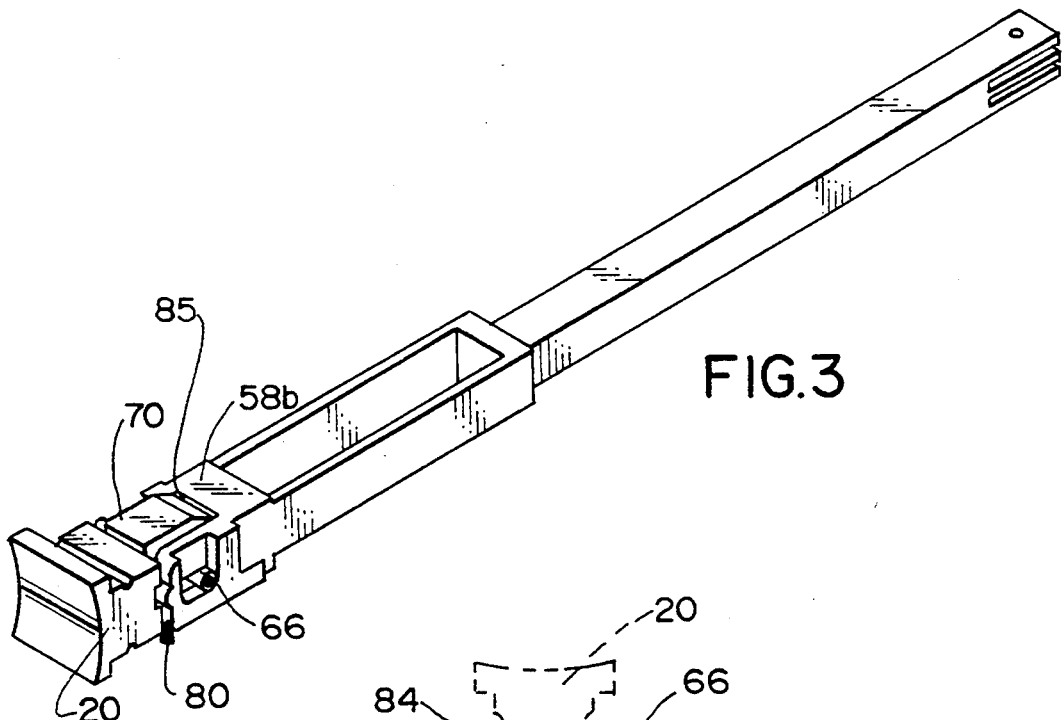
FIG. 3 is a perspective view of the push-rod, with the push-button being coaxial of the push-rod but capable of being rotated relative thereto.
Figure 5:
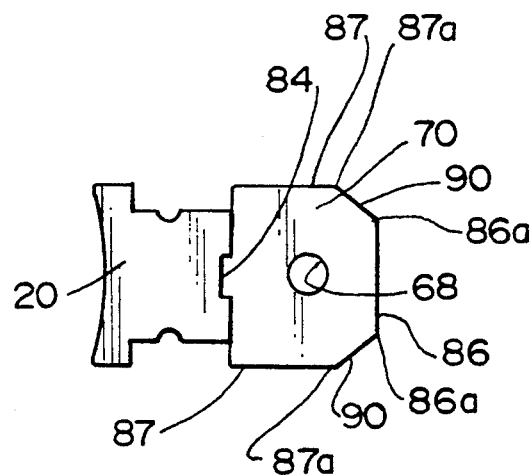
FIG. 5 is a side elevational view of the push-button, alone.
Figure 6A:
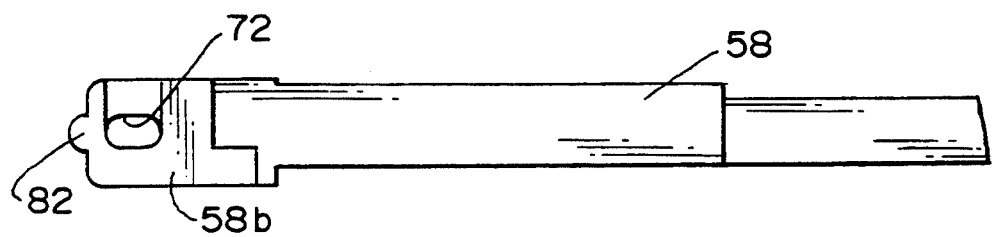
FIG. 6A is a side elevational view of the push-rod, alone.
Figure 6B:
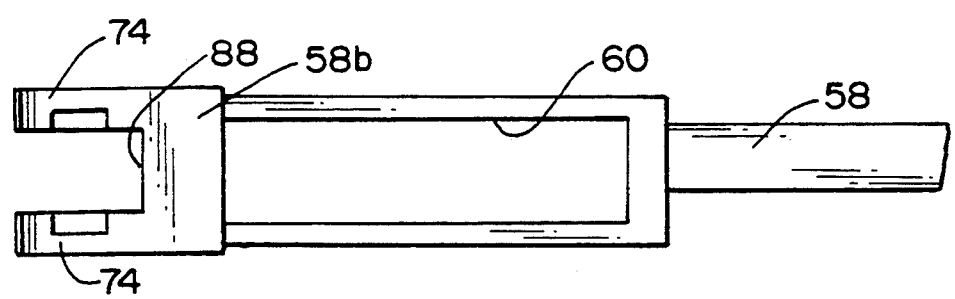
FIG. 6B is a top plan view of the push-rod.

Referring to FIGS. 3 and 5–6B in conjunction with FIGS. 1 and 2, push-button 20 is pivotally mounted to push-rod 58 by a spring pin 66 (FIG. 3). Spring pin 66 extends through a hole 68 (FIG. 5) in a mounting block portion 70 of push-button 20 and through an axially elongated hole 72 (FIG. 6A) in proximal end 58b of push-rod 58. FIG. 6B shows that the proximal end of the push-rod actually is bifurcated to define a pair of legs 74 between which mounting block 70 of the push-button is freely rotatable, shown more clearly in its assembled position in FIG. 3. Axially elongated hole 72 actually is provided in both legs 74 for receiving opposite ends of spring pin 66 that extends through hole 68 in the push-button.

Figure 4B:
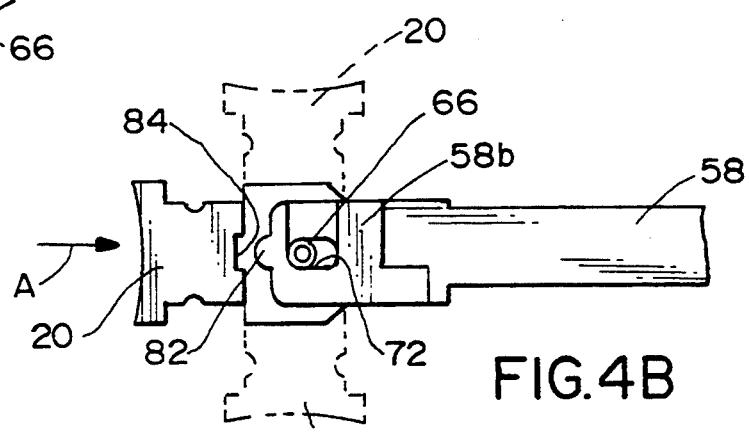
FIG. 4B is a view similar to that of FIG. 4A, with the push-button in its position of disengagement of the detent means, and with the push-button shown in phantom in its inoperative positions.

Referring to FIG. 4B, push-button 20 is shown in full lines therein generally coaxially of push-rod 58 in its operative position. By means of spring pin 66, the push-button can be moved, by pivoting, to inoperative positions shown in phantom alongside either opposite side of proximal end 58b of the push-rod. Therefore, in its operative position, pressure is applied to the push-button in the direction of arrow "A" to actuate the ejector mechanism and eject IC card 16 as described above in relation to FIG. 2. When it is desired not to afford ejection of the IC card or to otherwise prevent the push-button from projecting beyond the front face of a computer for example, push-button 20 can be pivoted or rotated to either of its inoperative positions shown in FIG. 4B in phantom.

Figure 4A:
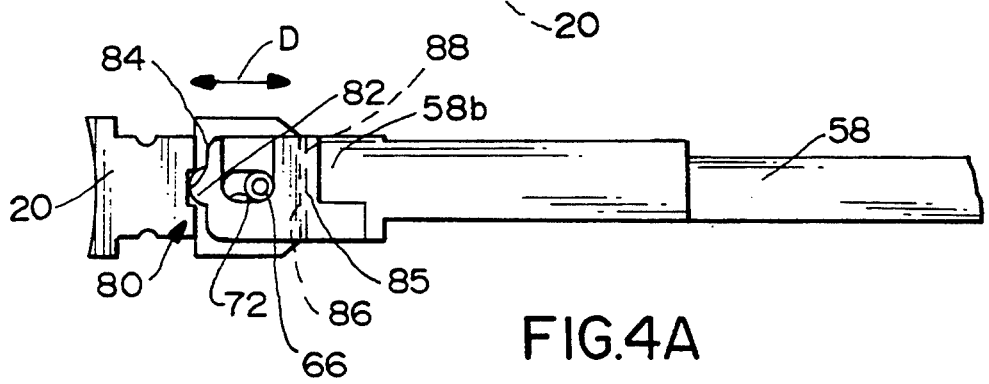
FIG. 4A is a side elevational view of the distal end of the push-rod with the push-button in its operative position and the detent means engaged.

Referring to FIG. 4A in comparison to FIG. 4B, it can be understood that axially elongated slot 72 in proximal end 58b of push-rod 58 allows spring pin 66 to move within the elongated slot. Therefore, push-button 20 can move axially in the direction of double-headed arrow "D" (FIG. 4A) relative to the push-rod. This lost motion of the pin within the elongated slot allows the push-button to be in an axial position as shown in FIG. 4B (with pin 66 at the extreme left end of slot 72) whereby the push-button is free to rotate between its operative and inoperative positions, i.e. between a position generally coaxial with the push-rod, and a position whereat the push-button is rotated from its coaxial position. FIG. 4A shows the push-button pushed coaxially inwardly relative to the push-rod, such that pin 66 is at the extreme right end of elongated slot 72. In this position, the invention contemplates the provision of complementary interengaging detent means, generally designated 80, between push-button 20 and push-rod 58 which resists pivotal movement of the push-button from its operative position to its inoperative positions.

More particularly, detent means 80 includes a detent boss 82 projecting axially outwardly of the push-rod and a detent recess 84 facing inwardly of push-button 20. The location of the detent recess and the detent boss on the push-button and the push-rod, respectively, are clearly shown in FIGS. 3 through 6A. Of course, the boss could be provided on the push-button and the recess on the push-rod, in a reverse configuration.

In operation of detent means 80, when push-button 20 is pushed coaxially inwardly relative to the push-rod, the detent boss and the detent recess will interengage as shown in FIG. 4A. This interengagement resists unintentional pivotal movement of the push-button away from its operative position, i.e. to its inoperative position, particularly when axial pressure is applied to the push-button.

In the preferred embodiment of the invention, detent means 80 are provided as a primary detent means, and a secondary detent means, generally designated 85, also are included in the mechanism. More particularly, FIG. 5 shows that the inner end of mounting block portion 70 of push-button 20 is provided with a flat surface 86, and proximal end 58b of the push-rod is provided with an opposing flat surface 88 (FIG. 6B). These two flat surfaces abut each other when the push-button is in its operative and actuated position shown in FIG. 4A. Flat surface 86 is slightly shorter than flat surface 88 whereby flat surface 86 further defines a pair of corners 86a engageable with flat surface 88 to resist pivotal movement of the push-button relative to the push-rod, particularly when the spring pin 66 is in the right most position of axial slot 72 as shown in FIGS. 3 and 4A. This surface-to-surface flat abutment provides for a firm push-button-push-rod joint and allows the push-button to transfer horizontal force components to the push-rod upon actuation, with minimal rotational movement of the push-button. Therefore, while in its operative position, the push-button will travel inwardly, i.e. in the direction of insertion of an IC card (as shown by arrow A in FIG. 2), and flat surface 86 of push-button 20 will be in engagement with flat surface 88 of push-rod 58. Upon completing its travel range (in the direction of arrow A), the push-rod/push-button assembly will have fully ejected an IC card, and push-button 20 will be protruding slightly away from the front face 12 of computer housing 10 in its operative position (FIG. 1). The push-button can now be rotated to its inoperative position (shown in phantom in FIG. 1) so it no longer protrudes from the front face of the housing.

FIG. 5 also shows that the mounting block portion 70 of push-button 20 is provided with two outside surfaces 87, either of which abuts the opposing flat surface 88 of proximal end 58b of the push-rod when the push-button is in its inoperative and unactuated position. Like the surface-to-surface abutment of flat surface 88 and flat surface 86, the surface-to-surface abutment of flat surface 87 and flat surface 88 provides for a firm joint and allows the push-rod, upon insertion of a card, to transfer horizontal force components to the push-button, with minimal rotational movement of the push-button. Flat surface 87 further defines a pair of corners 87a engageable with flat surface 88 to resist pivotal movement of the push-button relative to the push-rod during outward movement of the push-button/push-rod assembly. Therefore, while in its inoperative position, the push-button will travel outwardly, i.e. in the direction of ejection of the IC card (opposite the direction of arrow A), and flat surface 87 of push-button 20 will be in engagement with flat surface 88 of push-rod 58. Upon completing its travel range in the outward direction (i.e. opposite arrow A), the push-button will be in its inoperative position and can now be rotated to its operative position to allow it to be more easily accessible to a user. Note that when push-button 20 is in its inoperative position and when an IC card is engaged with header connector 24, the push-rod/push-button assembly will protrude from front face 12 of computer housing 10. However, actuation of push-button 20 in an ejecting direction (i.e. in the direction of arrow A) will be difficult due to the relative positions of push-rod 58 and push-button 20 and the relative shorter length of the assembly. That is to say, inadvertent ejection of a card can be minimized but not entirely prevented.

Referring back to FIG. 5, the sides of mounting block portion 70 of the push-button are chamfered between surfaces 86 and 87, as at 90 (FIG. 5), to facilitate rotation of the push-button relative to the push-rod, between its operative and inoperative positions, particularly in the position of the push-button shown in FIG. 4B, i.e. when the spring pin 66 is in the left most position of axial slot 72. During the rotation of the push-button between its operative and inoperative positions, the corners 86a and 87a of flat surfaces 86 and 87 respectively will minimally interfere with flat surface 88 to provide a clicking or tactile feedback to a user that the push-button is in or out of its operative (or inoperative) position.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an ejector system for ejecting an IC card from a connector apparatus which includes:

a header connector mateable with said IC card and including header terminals mounted therein adapted to mechanically and electrically engage corresponding IC card terminals mounted in the IC card, said IC card being moveable between an inserted position whereat the header terminals engage the IC card terminals, and an ejected position whereat said header terminals and said IC card terminals are disengaged, an ejector mechanism operatively associated with the header connector for moving the IC card to its ejected position, the ejector mechanism having a support structure mounted about the header connector, an eject lever pivotally mounted on the support structure and including a first end adapted to move the IC card to its ejected position and a second end, and a push-rod reciprocally mounted on the support structure having a distal end operatively associated with the second end of the eject lever and a proximal end adapted to be actuated by and to effect ejection of the IC card, wherein the improvement comprises:

a push-button pivotally mounted on said proximal end of the push-rod for pivotal movement between an operative position projecting generally coaxially of the push-rod and an inoperative position whereat the push-button is rotated from its operative position to one side of the push-rod.

2. In an ejector system as set forth in claim 1 wherein the push-rod is axially mounted within an integrally formed channel in the support structure.

3. In an ejector system as set forth in claim 1 further comprising complementary interengaging detent means between the push-button and the push-rod for resisting pivotal movement of the push-button between its operative position and its inoperative position.

4. In an ejector system as set forth in claim 3 wherein the push-button is pivotally connected to the push-rod by a spring pin, the spring pin extending through a generally round hole in the push-button and through a generally axially elongated slot in the push-rod.

5. In an ejector system as set forth in claim 4 wherein the relative position of the spring pin within the axially elongated slot of the push-rod allows the push-button to move between its operative and inoperative positions.

6. In an ejector system as set forth in claim 5 wherein the detent means resist pivotal movement of the push-button relative to the push-rod when the spring pin is positioned in the most distal location of the elongated slot.

7. In an ejector system as set forth in claim 3 wherein said detent means comprise a first transverse flat surface on the push-rod and a second transverse flat surface on the push-button, the second flat surface being shorter than the first flat surface to define detent corners engageable with the first flat surface to resist pivotal movement of the push-button.

8. In an ejector system as set forth in claim 7 wherein said push-button has chamfered surfaces at opposite ends of said second flat surface to facilitate movement of the push-button between its operative position and its inoperative position.

9. In an ejector system as set forth in claim 3 wherein said detent means comprise a detent boss on one of the push-button and the push-rod that is engageable axially in a detent recess in the other of the push-button and the push-rod when the push-button is in its operative position.

10. In an ejector system as set forth in claim 9 wherein said push-button is mounted for axial movement on the push-rod when the push-button is in its operative position for engaging the detent boss in the detent recess in response to axial force applied to the push-button.

11. In an ejector system as set forth in claim 9 wherein said detent boss and detent recess comprise a primary detent means for resisting movement to the inoperative position, and including a secondary detent means for resisting movement to the inoperative position in the form of a pair of opposing flat surfaces on the push-button and the push-rod, the flat surfaces being engageable when the push-button is in its operative position.

12. In an ejector system as set forth in claim 11 wherein said pair of flat surfaces comprise a first transverse flat surface on the push-rod and a second transverse flat surface on the push-button, the second flat surface being shorter than the first flat surface to define detent corners engageable with the first flat surface to resist pivotal movement of the push-button.

13. In an ejector mechanism for ejecting an IC card from a connector, including an eject lever adapted to effect ejection of the IC card from the connector, a push-rod reciprocally mounted about the connector and having a distal end operatively associated with the eject lever, and a proximal end opposite the distal end, wherein the improvement comprises a push-button pivotally mounted on said proximal end of the push-rod for pivotal movement between an operative position projecting generally coaxially of the push-rod and an inoperative position whereat the push-button is rotated from its operative position to one side of the push-rod.

14. In an ejector mechanism as set forth in claim 13 further Comprising complementary interengaging detent means between the push-button and the push-rod for resisting pivotal movement of the push-button between its operative position and its inoperative position.

15. In an ejector mechanism as set forth in claim 13 wherein said detent means comprise a first transverse flat surface on the push-rod and a second transverse flat surface on the push-button, the second flat surface being shorter than the first flat surface to define detent corners engageable with the first flat surface to resist pivotal movement of the push-button.

16. In an ejector mechanism as set forth in claim 15 wherein said push-button has chamfered surfaces at opposite ends of said second flat surface to facilitate movement of the push-button between its operative position and its inoperative position.

17. In an ejector mechanism as set forth in claim 13 wherein said detent means comprise a detent boss on one of the push-button and the push-rod that is engageable axially in a detent recess in the other of the push-button and the push-rod when the push-button is in its operative position.

18. In an ejector mechanism as set forth in claim 17 wherein said push-button is mounted for axial movement on the push-rod when the push-button is in its operative position for engaging the detent boss in the detent recess in response to axial force applied to the push-button.

19. In an ejector mechanism as set forth in claim 17 wherein said detent boss and detent recess comprise a primary detent means for resisting movement to the inoperative position, and including a secondary detent means for resisting movement to the inoperative position in the form of a pair of opposing flat surfaces on the push-button and the push-rod, the flat surfaces being engageable when the push-button is in its operative position.

20. In an ejector mechanism as set forth in claim 19 wherein said pair of flat surfaces comprise a first transverse flat surface on the push-rod and a second transverse flat surface on the push-button, the second flat surface being shorter than the first flat surface to define detent corners engageable with the first flat surface to resist pivotal movement of the push-button.

* * * * *